United States Patent
Pasch

Patent Number: 5,973,767
Date of Patent: Oct. 26, 1999

[54] OFF-AXIS ILLUMINATOR LENS MASK FOR PHOTOLITHOGRAPHIC PROJECTION SYSTEM

[75] Inventor: Nicholas F. Pasch, Pacifica, Calif.

[73] Assignee: LSI Logic Corporation, Milpitas, Calif.

[21] Appl. No.: 09/105,546

[22] Filed: Jun. 26, 1998

Related U.S. Application Data

[62] Division of application No. 08/700,650, Aug. 14, 1996.

[51] Int. Cl.[6] .................................................. G03B 27/72
[52] U.S. Cl. .............................. 355/67; 355/67; 355/69; 355/53.01; 355/53.3
[58] Field of Search ......................................... 355/67, 53

[56] References Cited

U.S. PATENT DOCUMENTS

| | | | |
|---|---|---|---|
| 5,114,223 | 5/1992 | Torigoe et al. | 353/101 |
| 5,117,255 | 5/1992 | Shiraishi et al. | 355/53 |
| 5,473,412 | 12/1995 | Ozawa | 355/69 |
| 5,502,313 | 3/1996 | Nakamura et al. | 250/559.26 |
| 5,629,805 | 5/1997 | Fukuzawa | 359/627 |
| 5,757,470 | 5/1998 | Dewa et al. | 355/67 |

*Primary Examiner*—Eddie C. Lee
*Assistant Examiner*—Emily C Jones

[57] ABSTRACT

The present invention provides for novel off-axis illuminator lens masks for semiconductor photolithographic projection systems. The masks are rotationally symmetric along axes 60° or 120° apart. Such masks can increase the contrast 30° and 60° with respect to the X and Y axes of an integrated circuit in a semiconductor wafer for the optimum printing of conducting lines along these directions.

4 Claims, 2 Drawing Sheets

OFF-AXIS ILLUMINATOR LENS MASK FOR PHOTOLITHOGRAPHIC PROJECTION SYSTEM

This application is a division of 08/700,650, filed Aug. 14, 1996.

BACKGROUND OF THE INVENTION

The present invention is related to the field of semiconductor photolithography and, more particularly, to semiconductor optical projection systems.

In present semiconductor photolithography, optical projection systems are presently being used to print circuit patterns upon the surface of semiconductor wafers. Each circuit pattern is defined in a layer of a semiconductor device so that a sequence of these circuit patterns form the semiconductor device. As these devices become more compact and dense, the individual elements forming the semiconductor device become smaller and smaller. Feature sizes of many advanced integrated circuits today are smaller than 0.5 μm.

These semiconductor photolithography projection systems have many refinements to enhance the printing capabilities of these systems. Among these refinements is the use of an off-axis mask for the illuminator lens of the projection system. The off-axis mask enhances the contrast of the pattern image which is projected onto a semiconductor wafer to create a circuit pattern on the wafer.

Nonetheless, there is still room for improvements in semiconductor photolithography projection systems. Unlike conventional semiconductor photolithography projection systems which take no advantage in emerging improvements in semiconductor technology, the present invention does.

SUMMARY OF THE INVENTION

The present invention is directed toward a semiconductor photolithographic projection system which has an optical source, a mask defining an image pattern, an illuminator lens disposed between the optical source and the mask for illuminating the image pattern with the light from the optical source, a primary lens disposed between the mask and a semiconductor wafer for focussing the image pattern from the mask onto the semiconductor wafer, and an off-axis illuminator lens mask approximately in the Fourier plane of the illuminator lens. The mask has a substantially flat surface with a pattern which is rotationally symmetric along predetermined axes about a center axis of the mask. The predetermined axes are aligned at 60 or 120° with respect to each other.

DETAILED DESCRIPTION OF PREFERRED EMBODIMENTS

Figure 1:
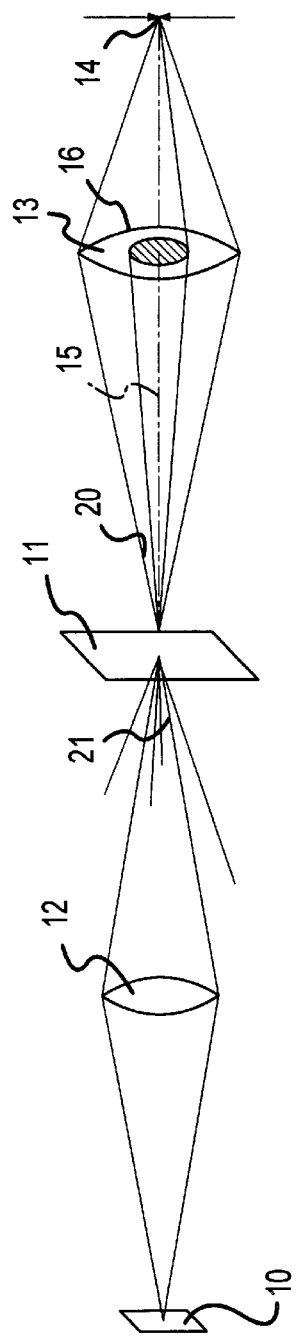
FIG. 1 illustrates the main elements of a semiconductor photolithography projection system.

The elements of a general semiconductor photolithography projection system are illustrated in FIG. 1. The system projects the pattern image of a mask 11 onto a semiconductor wafer 10 through a primary or imaging lens 12. To illuminate the mask 11, the system also has a light source 14 in the form of an arc lamp or laser source. The light from the source 14 is directed by an illuminator, or relay, lens 13 which directs the light against the mask 11. While the word "lens" are used for the elements 12 and 13, it should be understood that these lens are actually refined lens systems composed of a plurality of very finely adjusted and tuned lenses and can include refractive and reflective elements.

It should be noted that the illuminator lens 13 focuses the light from the source 14 to a point on the mask 11. The lens 13 subtends an incident angle δI as shown by an arc 20 at the mask 11. Likewise, the primary lens 12 subtends an outward angle ∠O shown by the arc 21 from a point on the mask 11 toward the lens 12. The ratio of the incident angle to the outward angle defines a spatial coherence σ by the following equation:

$$\sigma = \angle I / \angle O$$

For a given projection system using a light source having a particular wavelength λ, and lens systems of a particular numerical aperture, the spatial coherence a defines the contrast of the pattern on the mask 11 upon the semiconductor wafer 10. More precisely, the contrast, otherwise called the modulation transfer function, provides a measure of the difference between an exposed and unexposed portion of the semiconductor wafer. Of course, the greater the contrast, the better the image pattern to be formed on the wafer 10.

Figure 2:
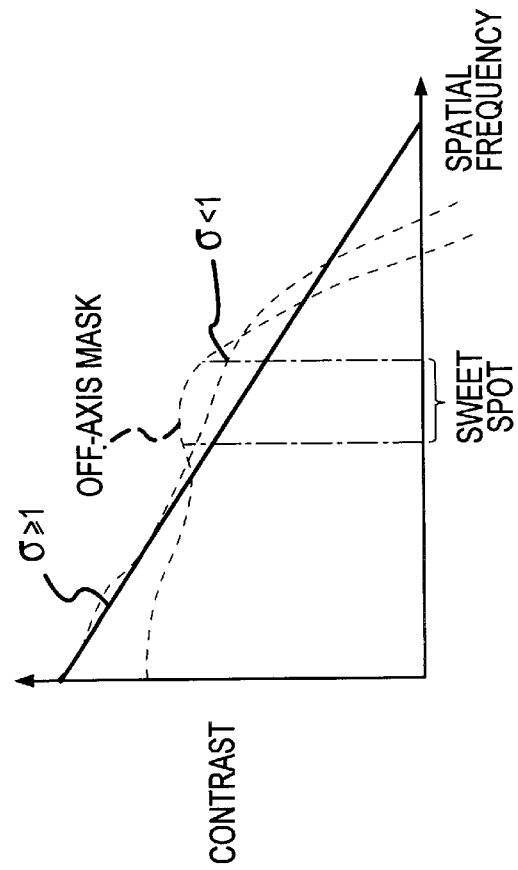
FIG. 2 is a graph of image contrast versus spatial frequency for different spatial coherences for a FIG. 1 system.

FIG. 2 is a generalized graph of contrast versus spatial frequency for a projection system, such as illustrated in FIG. 1. Spatial frequency quantifies the number of features per unit length and is an inverse measure of feature size projected unto the semiconductor wafer. Hence, as spatial frequency increases, feature size becomes smaller. For a projection system with σ≧1, the contrast is substantially a declining linear function with respect to an increase of the spatial frequency. In other words, as the feature size gets smaller, the contrast of the projection declines. For a σ<1, contrast is not a linear function of the spatial frequency. Rather, contrast varies so as to project above the inverse linear function for σ≧1. This region of spatial frequency is the so-called "sweet spot" for the projection system where contrast is high.

To further increase the contrast in the sweet spot, off-axis masks are used for the illuminator lens 13. FIG. 2 illustrates the increased contrast for the sweet spot with an off-axis mask. An off-axis mask blocks light along the central axis and allows light to pass through away from, or off, that axis. FIG. 1 illustrates an off-axis mask 16 in the form of an opaque disk centered about the central axis 15 which passes through the illuminator lens 13 between the mask 11 and light source 14.

Conventionally, the conducting lines of an integrated circuit are aligned along the X and Y axes, which define the rectangular shape of the integrated circuit. These axes are aligned by the scribe lines of the silicon semiconductor wafer along which the wafer is broken into the corresponding integrated circuits, i.e., chips, and the scribe lines follow the naturally occurring breakage lines of the silicon crystal of the wafer.

U.S. patent application No. 08/517,054 filed Aug. 21, 1995, and assigned to the present assignee, discloses an interesting discovery. If the conducting lines on an integrated circuit are aligned at 30° and 60° from the X–Y axes of the chip, the length of the conducting lines can be shortened. The shortened conducting lines result in increased operating speeds of an integrated circuit since the electrical signals on a conducting line require less time to reach their destination.

Figure 3:
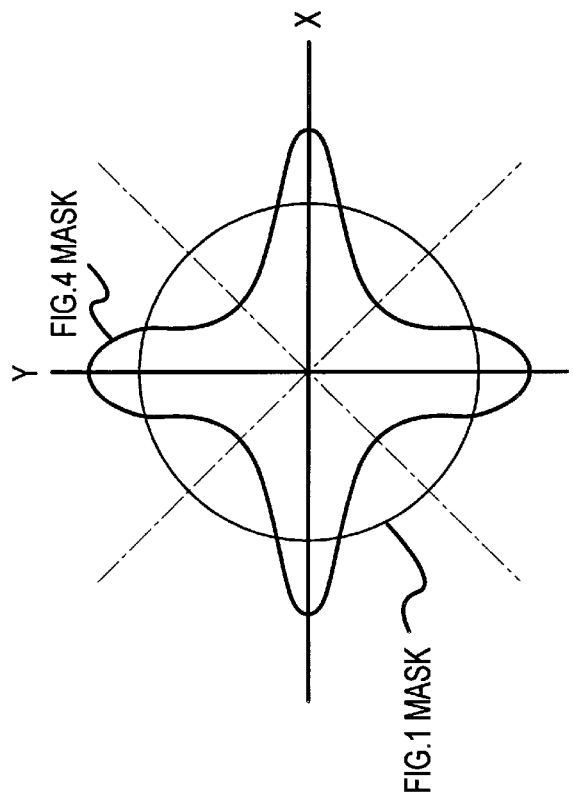
FIG. 3 is a generalized polar plot of contrast for prior art off-axis illuminator lens masks of the FIG. 1 system.
Figure 4:
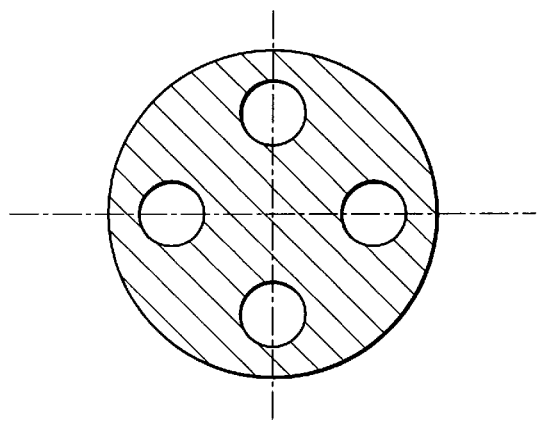
FIG. 4 is a representation of an off-axis illuminator lens mask found in the prior art.
Figure 5:
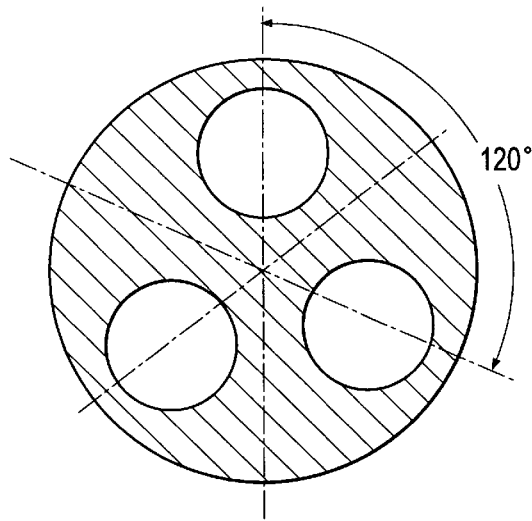
FIG. 5 is a representation of an off-axis illumination lens mask according to one embodiment of the present invention.
Figure 6:
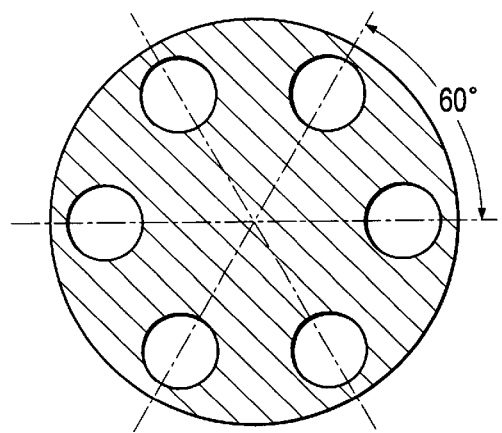
FIG. 6 is a representation of another off-axis illumination lens mask according to another embodiment of the present invention.

Conventional off-axis illuminator lens masks are either completely rotationally symmetric, such as the mask 16 shown in FIG. 1, or rotationally symmetric along the X and Y axes of the integrated circuit, such as the mask shown in FIG. 4. These illuminator lens masks are substantially flat with transmissive and opaque portions. The shaded portions of the masks in FIGS. 4–6 are opaque and the clear portions are transmissive. As might be expected, the FIG. 1 mask which is completely rotationally symmetric, i.e., over all directions, has the same contrast over 360°. FIG. 3 plots the contrast in polar coordinates for the mask 16 of FIG. 1. The distance of a point from the center of the graph indicates the amount of contrast in that direction on the semiconductor wafer.

The mask in FIG. 4 is rotationally symmetric at 90° intervals. As shown in FIG. 3, the contrast created from that mask has maxima at 90° with respect to each other. None of these conventional masks have maxima at 30° and 60° from the X and Y axes. Note that if the FIG. 4 mask were rotated 30° or 60°, the contrast maxima of FIG. 3 would also be correspondingly rotated 30° or 60°. For example, if the mask were rotated 30° clockwise from the vertical Y axis, there is no contrast maxima 60° clockwise from the Y axis (equivalently 30° counterclockwise from the X axis).

In accordance with the present invention, off-axis illuminator lens masks which are rotationally symmetric along axes displaced at the appropriate angles from the X and Y axes are used. FIG. 5 illustrates an off-axis mask having these axes at 120° with respect to each other. Such a mask creates contrast maxima which are properly aligned. That is, there are contrast maxima along the Y axis, at 30° clockwise from the X axis (60° counterclockwise from the Y axis), and at 30° counterclockwise from the X axis (60° clockwise from the Y axis).

Likewise, FIG. 6 illustrates another mask according to the present invention in which the axes are displaced 60° with each other. This off-axis mask generates contrast maxima along the X axis, at 30° clockwise from the Y axis (60° counterclockwise from the X axis), and at 30° counterclockwise from the Y axis (60° clockwise from the X axis). The location of these maxima should be evident from the location of the transmissive, i.e., clear, portions of the masks of FIGS. 5 and 6.

Thus the present invention creates a semiconductor photolithography projection system which optimizes the printing of conducting lines at 30° and 60° from the X and Y axes of an integrated circuit chip. Stated differently, the projection system has optimized contrast on the chip along axes spaced at 60° with respect to each other. By rotating the off-axis illuminator lens mask, the optimized contrast axes are aligned at 30° and 60° from the X and Y axes of an integrated circuit chip. The resulting integrated circuit has increased operating speeds over conventional integrated circuits.

While the above is a complete description of the preferred embodiments of the present invention, various alternatives, modifications and equivalents may be used. It should be evident that the present invention is equally applicable by making appropriate modifications to the embodiment described above. For example, it should be evident that the absolute diameter of the clear areas of the off-axis mask can be altered to increase illumination intensity, with predictable degradation of the image contrast. Therefore, the above description should not be taken as limiting the scope of invention which is defined by the metes and bounds of the appended claims.

What is claimed is:

1. An improved semiconductor wafer photolithographic system for projecting an image pattern onto a semiconductor wafer, said system comprising:

an optical source for generating light;

a mask defining said image pattern;

an illuminator lens disposed between said optical source and said mask for illuminating said image pattern from said optical source light;

primary lens disposed between said mask and said semiconductor water for focussing said image pattern from said mask onto said semiconductor wafer; and an off-axis illuminator lens mask mounted between said optical source and said illuminator lens, centered about a central optical axis, said mask having a plurality of discrete transmissive portions and a contiguous opaque portion, said transmissive portions being spaced at 60 degree or 120 degree intervals with respect to each other.

2. The improved semiconductor wafer photolithographic system of claim 1 wherein said pattern of said off-axis illuminator lens mask has transmissive portions along said axes.

3. For a semiconductor wafer photolithographic projection device, an off-axis illuminator lens mask centered about a central optical axis, comprising a substantially flat surface having a pattern thereon comprised of a plurality of discrete transmissive portions and an opaque portion, said discrete transmissive portions being spaced at 60 degrees or 120 degrees with respect to each other.

4. The off-axis illuminator lens mask of claim 3 wherein said pattern of said off-axis illuminator lens mask has transmissive portions along said axes.

* * * * *